(12) United States Patent
Chen et al.

(10) Patent No.: US 9,672,307 B2
(45) Date of Patent: Jun. 6, 2017

(54) CLOCK PLACEMENT FOR PROGRAMMABLE LOGIC DEVICES

(71) Applicant: Lattice Semiconductor Corporation, Hillsboro, OR (US)

(72) Inventors: Chih-Chung Chen, Palo Alto, CA (US); Yanhua Yi, Cupertino, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 14/698,785

(22) Filed: Apr. 28, 2015

(65) Prior Publication Data

US 2016/0321385 A1 Nov. 3, 2016

(51) Int. Cl.
*G06F 17/50* (2006.01)

(52) U.S. Cl.
CPC ...... *G06F 17/5054* (2013.01); *G06F 2217/62* (2013.01)

(58) Field of Classification Search
CPC ............. G06F 17/5031; G06F 17/5045; G06F 17/5054; G06F 17/5068; G06F 17/5081; G06F 2217/62
USPC .................................. 716/101, 104, 110, 117
See application file for complete search history.

(56) References Cited

U.S. PATENT DOCUMENTS

| | | | | |
|---|---|---|---|---|
| 7,143,380 | B1 * | 11/2006 | Anderson | G06F 17/509 716/114 |
| 8,205,182 | B1 * | 6/2012 | Zlatanovici | G06F 17/505 703/16 |
| 8,707,229 | B1 * | 4/2014 | Dobkin | G06F 17/5031 716/106 |

OTHER PUBLICATIONS

L.R. Ford, Jr. and D.R. Fulkerson, Maximal Flow Through a Network, Rand Corporation, Santi Monica, California, Sep. 20, 1955, pp. 399-404.
S. Kirkpatrick, C.D. Gelatti, and M.P. Vecchi, Optimization by Simulated Annealing, Science, New Series, vol. 220, No. 4598, May 13, 1983, pp. 671-680.

* cited by examiner

*Primary Examiner* — Paul Dinh
(74) *Attorney, Agent, or Firm* — Haynes and Boone, LLP (57) ABSTRACT

Various techniques are provided to efficiently implement user designs in programmable logic devices (PLDs). In one example, a computer-implemented method includes determining clock resources in a design identifying operations to be performed by a PLD, determining available clock resources of the PLD, determining a flow network model corresponding to the design and the PLD, and determining a clock resource placement based on the flow network model. The flow network model may include a plurality of levels of vertices disposed between source and sink vertices, where vertices are coupled to each other using edges with unit capacity.

21 Claims, 8 Drawing Sheets

CLOCK PLACEMENT FOR PROGRAMMABLE LOGIC DEVICES

TECHNICAL FIELD

The present invention relates generally to programmable logic devices and, more particularly, to placement of clock resources in programmable logic devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources (e.g., programmable logic gates, look-up tables (LUTs), embedded hardware, or other types of resources) and interconnections available in particular PLDs. Physical placement and routing for the synthesized and mapped user designs may then be determined to generate configuration data for the particular PLDs.

Each user design typically includes clock signals to coordinate operation of various components within the user design, and each PLD has a limited number of clock resources (e.g., clock driver input/output pins, feedline interconnects between such clock driver sources and other components of the PLD, and/or other PLD resources) to implement the user design. Conventional methods for physical placement of clock resources can take a relatively long time to complete and can fail without indicating whether a solution exists, and these problems are exacerbated as the number of available clock resources for PLDs becomes increasingly limited relative to the portion of the PLD dedicated to implementing other aspects (e.g., desired logic operations) of a user design. Moreover, such conventional methods may also be susceptible to inefficiently allocating clock resources, which can negatively impact other characteristics of the user design, such as achievable throughput or clock speed.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

In accordance with embodiments set forth herein, techniques are provided to efficiently implement user designs in programmable logic devices (PLDs). For example, a user design may be converted into and/or represented by a set of PLD components (e.g., configured for logic, arithmetic, clocking, or other hardware functions) and their associated interconnections available in a PLD. For example, a PLD may include a number of programmable logic blocks (PLBs), each PLB including a number of logic cells, and configurable routing resources that may be used to interconnect the PLBs and/or logic cells.

In general, a PLD (e.g., an FPGA) fabric includes one or more routing structures and an array of similarly arranged logic cells arranged within programmable function blocks (e.g., PFBs and/or PLBs), all driven by clock signals propagated throughout the PLD. The goal in designing a particular type of PLD is to maximize functionality while minimizing area, power, and delay of the fabric.

In various embodiments, a PLD may include a limited number of a specific type of resource, such as clock driver sources and/or associated feedline interconnects (e.g., allowing clock signals at the clock driver sources to reach other PLD components), that is unique to that type or model of PLD. In order to implement a particular user design, clock drivers in the user design must be identified and placed at compatible clock driver sources in the PLD and coupled to appropriate feedline interconnects available in the PLD. Because the clock driver sources and feedline interconnects in a particular PLD are limited both in number and in where and how they can be placed relative to one another, clock resource placement can be difficult to accomplish efficiently.

Conventional methods use a trial and error approach that attempts to place clock resources by randomly selecting a clock driver source from a set of compatible clock driver sources in the PLD and then randomly assigning the selected clock driver source to an available feedline interconnect. Such methods fail if a selected clock driver source has no available feedline interconnect. For example, a particular clock driver source typically can only be coupled to a subset of the available feedline interconnects (e.g., due to space/cost limitations in the manufacture of the PLD), and that subset often overlaps with similar subsets available to other clock driver sources in the PLD. As such, all feedline interconnects available to a particular clock driver source can become populated before that clock driver source is fully placed and interconnected.

To illustrate, the following tables 1 and 2 illustrate a user design including three clock drivers and a PLD including three compatible clock driver sources (as shown in Table 1) with associated available feedline interconnects (as shown in Table 2).

TABLE 1

| Clock Driver | Compatible Clock Driver Source |
|---|---|
| d1 | {s1, s2} |
| d2 | {s1, s2} |
| d3 | {s2, s3} |

TABLE 2

| Clock Driver Source | Available Feedline Interconnects |
|---|---|
| s1 | {f1, f2} |
| s2 | {f2, f3} |
| s3 | {f1, f3} |

A conventional random selection based method may place clock drivers d1 and d2 badly early in the process and then fail to place all clock drivers before completing clock resource placement. For example, step 1 of such a method may place driver d1 at clock driver source s1 and assign feedline interconnect f1 to s1 (d1→s1→f1), and step 2 may place driver d2 at clock driver source s2 and assign feedline interconnect f3 to s2 (d2→s2→f3). As a result, d3 can only be placed at s3 (d3→s3), but both of the available feedline interconnects f1 and f3 are populated, so the process fails, and it fails only after a substantial portion of the process has been completed and the associated computing resources (e.g., memory, time) have been used. Moreover, the process fails without indicating that a solution exists (e.g., d1→s1→f1; d2→s2→f2; d3→s3→f3).

Thus, not only do conventional methods waste computing resources, they also fail to probe the available search space for a solution. This is particularly a problem for relatively complex user designs (e.g., with over thirty clock drivers) and relatively limited clock resources, where the ratio of bad partial placements (e.g., resulting in failure to place all clock resources) to possible solutions is relatively high. Moreover, such conventional methods do not optimize clock resource placement to minimize clock resource utilization and/or provide higher throughput and/or attainable clock speed.

Embodiments of the present disclosure overcome these problems by translating the clock resource placement to an appropriate flow network model that can be configured to determine a solution relatively quickly and with relatively little memory overhead. In various embodiments, such solutions may be used to determine a valid and/or optimized clock resource placement in a PLD, as described herein. In some embodiments, such solutions may be used to determine a valid solution does not exist, thereby indicating that the user design is incompatible with the selected type of PLD. In related embodiments, non-valid solutions may be used to help adjust a user design to make it compatible with a selected type of PLD, for example, or to help select a compatible type of PLD.

As a result of such process (e.g., valid and/or optimized clock resource placement), a user design can be implemented relatively efficiently, thereby freeing up the configurable PLD components that would otherwise be occupied by clock resources. Furthermore, the propagation delay of the resulting user design may also be reduced, which in some cases may advantageously permit an increase in the clock frequency of a PLD configured with the user design. In some embodiments, the optimized user design may be represented by a netlist that identifies various types of components provided by the PLD and their associated signals. In embodiments that produce a netlist of the converted user design, the optimization process may be performed on such a netlist, as described herein.

Figure 1:
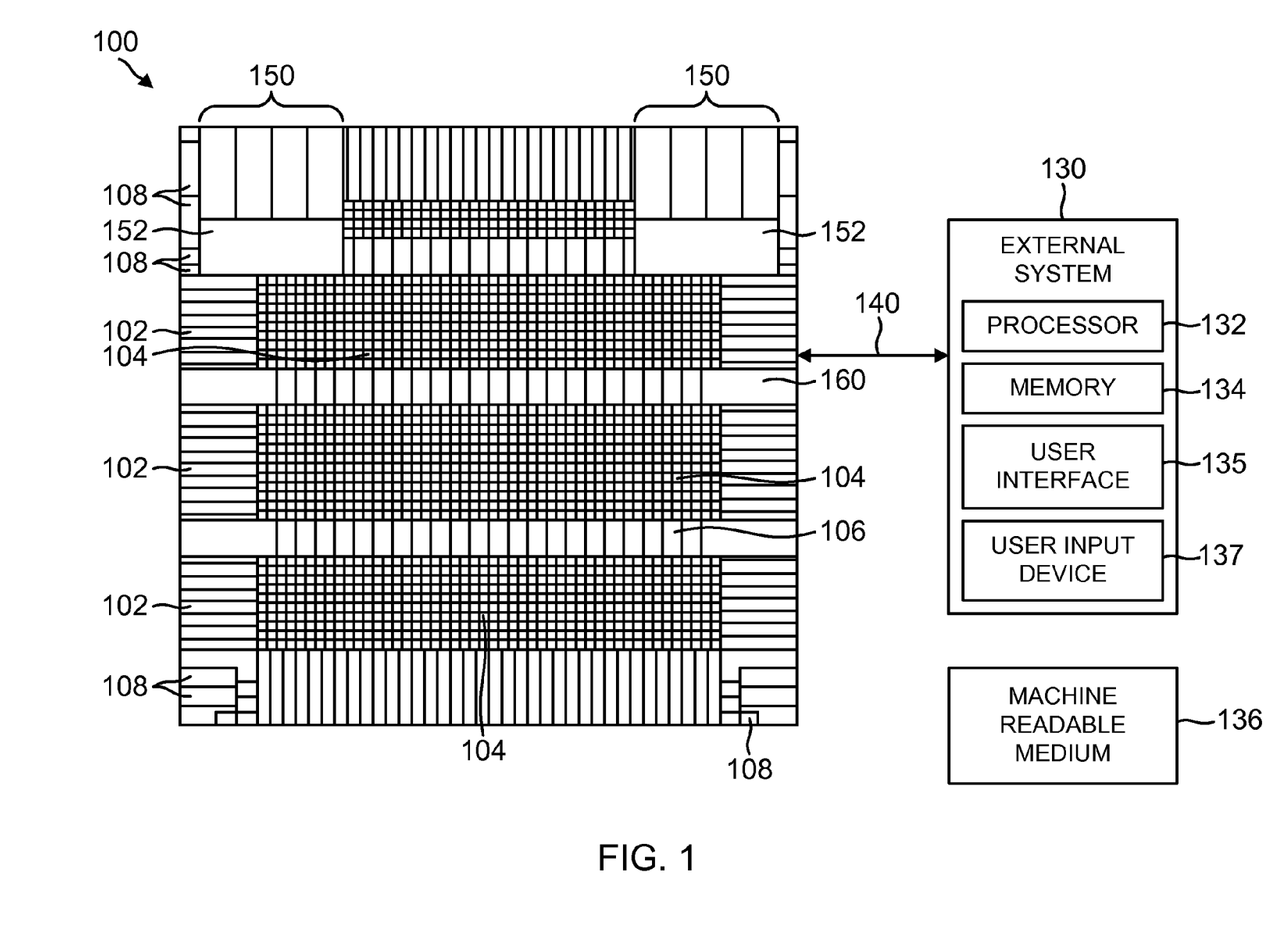
FIG. 1 illustrates a block diagram of a programmable logic device (PLD) in accordance with an embodiment of the disclosure.

Referring now to the drawings, FIG. 1 illustrates a block diagram of a PLD 100 in accordance with an embodiment of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while programmable logic blocks 104 provide logic functionality (e.g., look up table (LUT) based logic or logic gate array based logic) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock driver sources, PLL circuits, DLL circuits, and/or feedline interconnects), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, certain I/O blocks 102 may be used for programming memory 106 or transferring information (e.g., various types of user data and/or control signals) to/from PLD 100. Other I/O blocks 102 include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, I/O blocks 102 may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104, hard IP blocks 160, and routing resources (e.g., routing resources 180 of FIG. 2) to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may provide such configuration data to one or more I/O blocks 102, SERDES blocks 150, and/or other portions of PLD 100. As a result, programmable logic blocks 104, various routing resources, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, system 130 may run PLD configuration software, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100.

Figure 2:
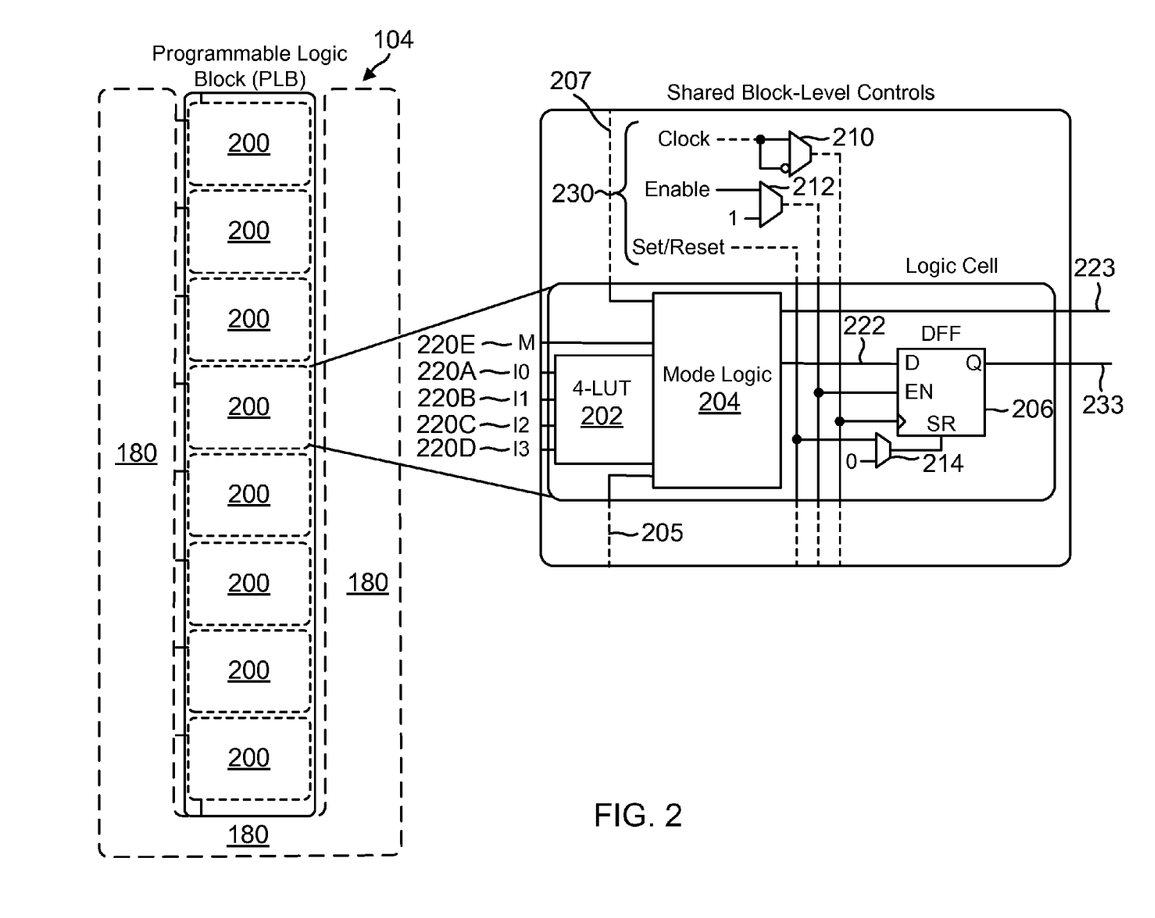
FIG. 2 illustrates a block diagram of a logic block for a PLD in accordance with an embodiment of the disclosure.

FIG. 2 illustrates a block diagram of a logic block 104 of PLD 100 in accordance with an embodiment of the disclosure. As discussed, PLD 100 includes a plurality of logic blocks 104 including various components to provide logic and arithmetic functionality, which can also be used to implement clock signal processing and/or functionality (e.g., a clock a clock divider, a clock signal delay, a clock signal propagator, and/or other clock signal processing and/or functionality).

In the example embodiment shown in FIG. 2, logic block 104 includes a plurality of logic cells 200, which may be interconnected internally within logic block 104 and/or externally using routing resources 180. For example, each logic cell 200 may include various components such as: a lookup table (LUT) 202, a mode logic circuit 204, a register 206 (e.g., a flip-flop or latch), and various programmable multiplexers (e.g., programmable multiplexers 212 and 214) for selecting desired signal paths for logic cell 200 and/or between logic cells 200. In this example, LUT 202 accepts four inputs 220A-220D, which makes it a four-input LUT (which may be abbreviated as "4-LUT" or "LUT4") that can be programmed by configuration data for PLD 100 to implement any appropriate logic operation having four inputs or less. Mode logic 204 may include various logic elements and/or additional inputs, such as input 220E, to support the functionality of various modes for logic cell 200 (e.g., including various clock signal processing and/or functionality modes). LUT 202 in other examples may be of any other suitable size having any other suitable number of inputs for a particular implementation of a PLD. In some embodiments, different size LUTs may be provided for different logic blocks 104 and/or different logic cells 200.

An output signal 222 from LUT 202 and/or mode logic 204 may in some embodiments be passed through register 206 to provide an output signal 233 of logic cell 200. In various embodiments, an output signal 223 from LUT 202 and/or mode logic 204 may be passed to output 223 directly, as shown. Depending on the configuration of multiplexers 210-214 and/or mode logic 204, output signal 222 may be temporarily stored (e.g., latched) in latch 206 according to control signals 230. In some embodiments, configuration data for PLD 100 may configure output 223 and/or 233 of logic cell 200 to be provided as one or more inputs of another logic cell 200 (e.g., in another logic block or the same logic block) in a staged or cascaded arrangement (e.g., comprising multiple levels) to configure logic and/or other operations that cannot be implemented in a single logic cell 200 (e.g., operations that have too many inputs to be implemented by a single LUT 202). Moreover, logic cells 200 may be implemented with multiple outputs and/or interconnections to facilitate selectable modes of operation, as described herein.

Mode logic circuit 204 may be utilized for some configurations of PLD 100 to efficiently implement arithmetic operations such as adders, subtractors, comparators, counters, or other operations, to efficiently form some extended logic operations (e.g., higher order LUTs, working on multiple bit data), to efficiently implement a relatively small RAM, and/or to allow for selection between logic, arithmetic, extended logic, and/or other selectable modes of operation. In this regard, mode logic circuits 204, across multiple logic cells 202, may be chained together to pass carry-in signals 205 and carry-out signals 207, and/or other signals (e.g., output signals 222) between adjacent logic cells 202, as described herein. In the example of FIG. 2, carry-in signal 205 may be passed directly to mode logic circuit 204, for example, or may be passed to mode logic circuit 204 by configuring one or more programmable multiplexers. In some embodiments, mode logic circuits 204 may be chained across multiple logic blocks 104.

Logic cell 200 illustrated in FIG. 2 is merely an example, and logic cells 200 according to different embodiments may include different combinations and arrangements of PLD components. Also, although FIG. 2 illustrates logic block 104 having eight logic cells 200, logic block 104 according to other embodiments may include fewer logic cells 200 or more logic cells 200. Each of the logic cells 200 of logic block 104 may be used to implement a portion of a user design implemented by PLD 100. In this regard, PLD 100 may include many logic blocks 104, each of which may include logic cells 200 and/or other components which are used to collectively implement the user design.

Figure 3:
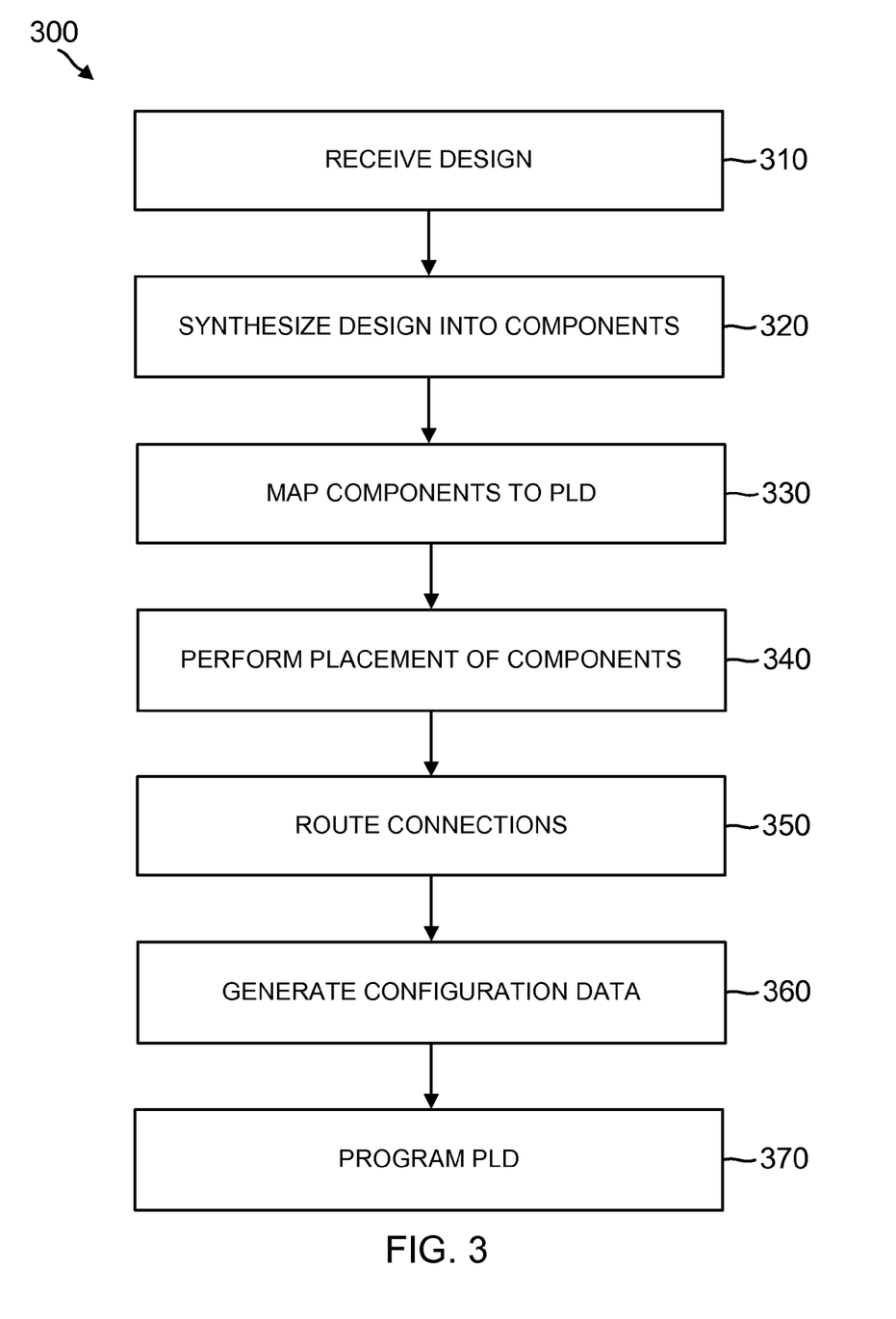
FIG. 3 illustrates a design process for a PLD in accordance with an embodiment of the disclosure.

FIG. 3 illustrates a design process 300 for a PLD in accordance with an embodiment of the disclosure. For example, the process of FIG. 3 may be performed by system 130 running Lattice Diamond software to configure PLD 100. In some embodiments, the various files and information referenced in FIG. 3 may be stored, for example, in one or more databases and/or other data structures in memory 134, machine readable medium 136, and/or otherwise.

In operation 310, system 130 receives a user design that specifies the desired functionality of PLD 100. For example, the user may interact with system 130 (e.g., through user input device 137 and hardware description language (HDL) code representing the design) to identify various features of the user design (e.g., high level logic operations, hardware configurations, and/or other features). In some embodiments, the user design may be provided in a register transfer level (RTL) description (e.g., a gate level description). System 130 may perform one or more rule checks to confirm that the user design describes a valid configuration of PLD 100. For example, system 130 may reject invalid configurations and/or request the user to provide new design information as appropriate.

In operation 320, system 130 synthesizes the design to create a netlist (e.g., a synthesized RTL description) identifying an abstract logic implementation of the user design as a plurality of logic components (e.g., also referred to as netlist components). In some embodiments, the netlist may be stored in Electronic Design Interchange Format (EDIF) in a Native Generic Database (NGD) file.

In some embodiments, synthesizing the design into a netlist in operation 320 may involve converting (e.g., translating) the high-level description of logic operations, hardware configurations, and/or other features in the user design into a set of PLD components (e.g., logic blocks 104, logic cells 200, and other components of PLD 100 configured for logic, arithmetic, or other hardware functions to implement the user design) and their associated interconnections or signals. Depending on embodiments, the converted user design may be represented as a netlist.

In some embodiments, synthesizing the design into a netlist in operation 320 may further involve performing an optimization process on the user design (e.g., the user design converted/translated into a set of PLD components and their associated interconnections or signals) to reduce propagation delays, consumption of PLD resources and routing resources, and/or otherwise optimize the performance of the PLD when configured to implement the user design. Depending on embodiments, the optimization process may be performed on a netlist representing the converted/translated user design. Depending on embodiments, the optimization process may represent the optimized user design in a netlist (e.g., to produce an optimized netlist).

In some embodiments, the optimization process may include optimizing clock resources identified in a user design. For example, the optimization process may include detecting clock functionality and/or corresponding routing resources in the user design, and interchanging and/or combining PLD resources implementing the various operations to reduce the number of PLD components and/or routing resources used to implement the operations and/or to reduce the propagation delay associated with the operations.

In operation 330, system 130 performs a mapping process that identifies components of PLD 100 that may be used to implement the user design. In this regard, system 130 may map the optimized netlist (e.g., stored in operation 320 as a result of the optimization process) to various types of components provided by PLD 100 (e.g., logic blocks 104, logic cells 200, embedded hardware, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 320 to produce a netlist that is mapped to PLD components.

In operation 340, system 130 performs a placement process to assign the mapped netlist components to particular physical components residing at specific physical locations of the PLD 100 (e.g., assigned to particular logic cells 200, logic blocks 104, clock-related circuitry 108, routing resources 180, and/or other physical components of PLD 100), and thus determine a layout for the PLD 100. In some embodiments, the placement may be performed on one or more previously-stored NCD files, with the placement results stored as another physical design file.

In operation 350, system 130 performs a routing process to route connections (e.g., using routing resources 180) among the components of PLD 100 based on the placement layout determined in operation 340 to realize the physical interconnections among the placed components. In some embodiments, the routing may be performed on one or more previously-stored NCD files, with the routing results stored as another physical design file.

In various embodiments, routing the connections in operation 350 may further involve performing an optimization process on the user design to reduce propagation delays, consumption of PLD resources and/or routing resources, and/or otherwise optimize the performance of the PLD when configured to implement the user design. The optimization process may in some embodiments be performed on a physical design file representing the converted/translated user design, and the optimization process may represent the optimized user design in the physical design file (e.g., to produce an optimized physical design file).

In some embodiments, the optimization process may include optimizing clock resources identified in a user design. For example, the optimization process may include detecting clock functionality and/or corresponding routing resources in the user design, and interchanging and/or combining PLD resources implementing the various operations to reduce the number of PLD components and/or routing resources used to implement the operations and/or to reduce the propagation delay associated with the operations.

Changes in the routing may be propagated back to prior operations, such as synthesis, mapping, and/or placement, to further optimize various aspects of the user design.

Thus, following operation 350, one or more physical design files may be provided which specify the user design after it has been synthesized (e.g., converted and optimized), mapped, placed, and routed (e.g., further optimized) for PLD 100 (e.g., by combining the results of the corresponding previous operations). In operation 360, system 130 generates configuration data for the synthesized, mapped, placed, and routed user design. In operation 370, system 130 configures PLD 100 with the configuration data by, for example, loading a configuration data bitstream into PLD 100 over connection 140.

Figure 4:
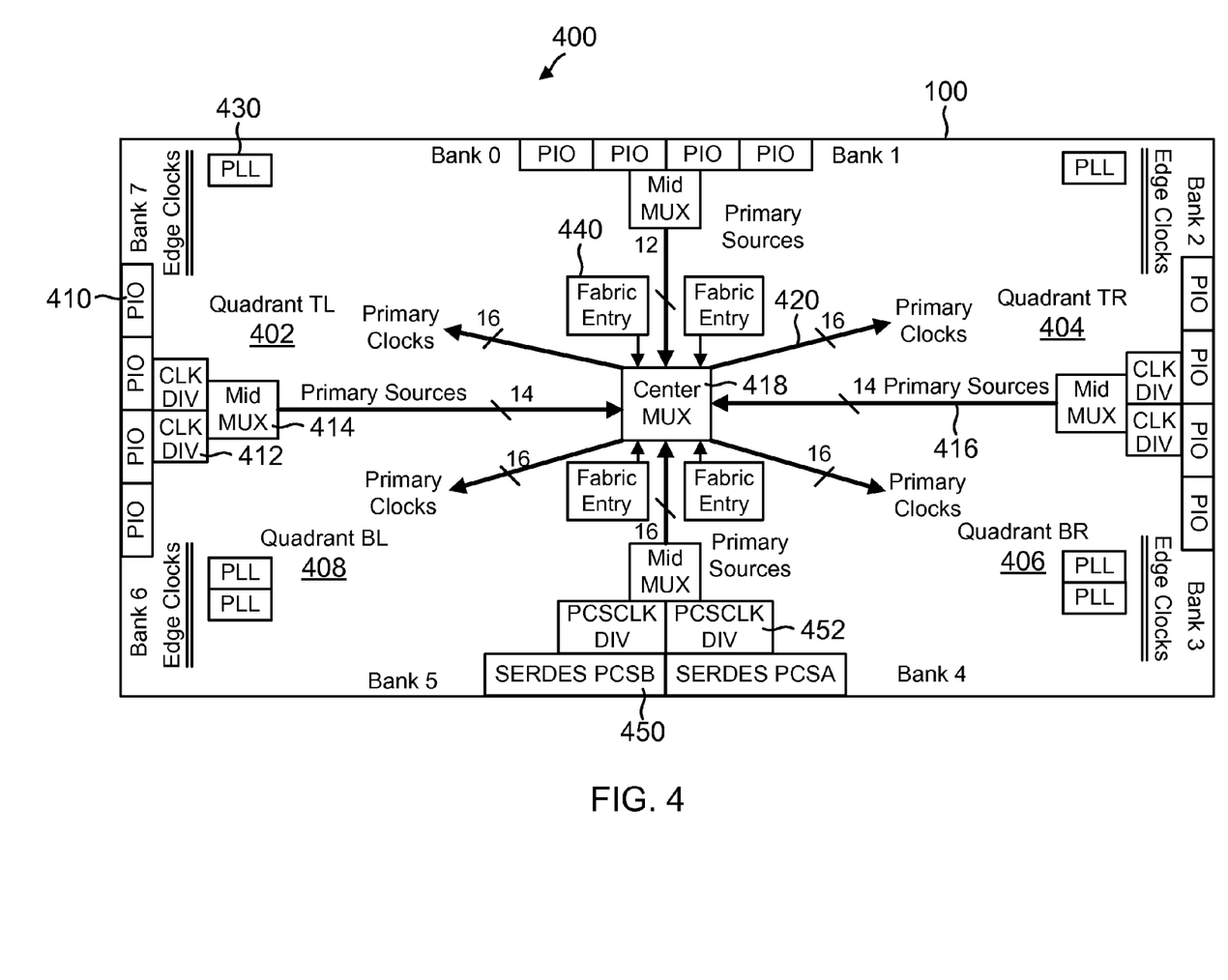
FIG. 4 illustrates a block diagram of available clock resources for a PLD in accordance with an embodiment of the disclosure.

FIG. 4 illustrates a block diagram 400 of available clock resources for PLD 100 in accordance with an embodiment of the disclosure. In some embodiments, PLD 100 may be manufactured to include various edge clock driver sources (e.g., clock driver I/O pins 410) configured to provide clock signals over feedline interconnects 416 to a center multiplexer 418 that is itself configured to provide multiplexed clock signals over distribution feedlines 420 to any one of PLD quadrants 402, 404, 406, and/or 408, as shown. In such embodiments, an edge-to-center arrangement provides for relatively simple, low delay, and flexible distribution of clock signals throughout PLD 100. In other embodiments, PLD 100 may be manufactured to include one or more edge clock driver sources that are configured to provide clock signals over different feedline interconnects (e.g., a different clock signal distribution arrangement) to a limited area of PLD 100, such as a single quadrant of PLD 100.

In the embodiment shown in FIG. 4, PLD 100 also includes phase locked loop (PLL) clock driver sources 430, logic clock driver sources (e.g., PLD fabric entries) 440, and SERDES clock driver sources 450, which are other types of clock driver sources compatible with PLL clock drivers, logic clock drivers, and SERDES clock drivers, respectively, in a user design. In particular, SERDES clock driver sources 450 may be configured to extract a clock signal from a serial data signal supplied to SERDES clock driver sources 450 and supply the clock signal (e.g., potentially clock divided by clock divider 452) to a middle multiplexer 414 and/or center multiplexer 418. Clock driver I/O pins 410 are compatible with I/O clock drivers (e.g., externally coupled clock signals) in a user design.

In various embodiments, PLD may include clock dividers 412 and/or middle multiplexers 414 configured to divide and/or multiplex clock signals from clock driver I/O pins 410 before they are provided to feedline interconnects 416 according to an feedline interconnect pattern specific to the type of PLD 100. For example, in order to reduce overall physical area of PLD 100 and boost clock performance, the interface between clock driver sources of PLD 100 (e.g., clock driver I/O pins 410, PLL clock driver sources 430, and/or other clock driver sources utilizing feedline interconnects 416) and associated feedline interconnects 416 may not be one-to-one, and so a PLD-specific constraint may be imposed on clock driver placement in PLD 100.

Figure 5:
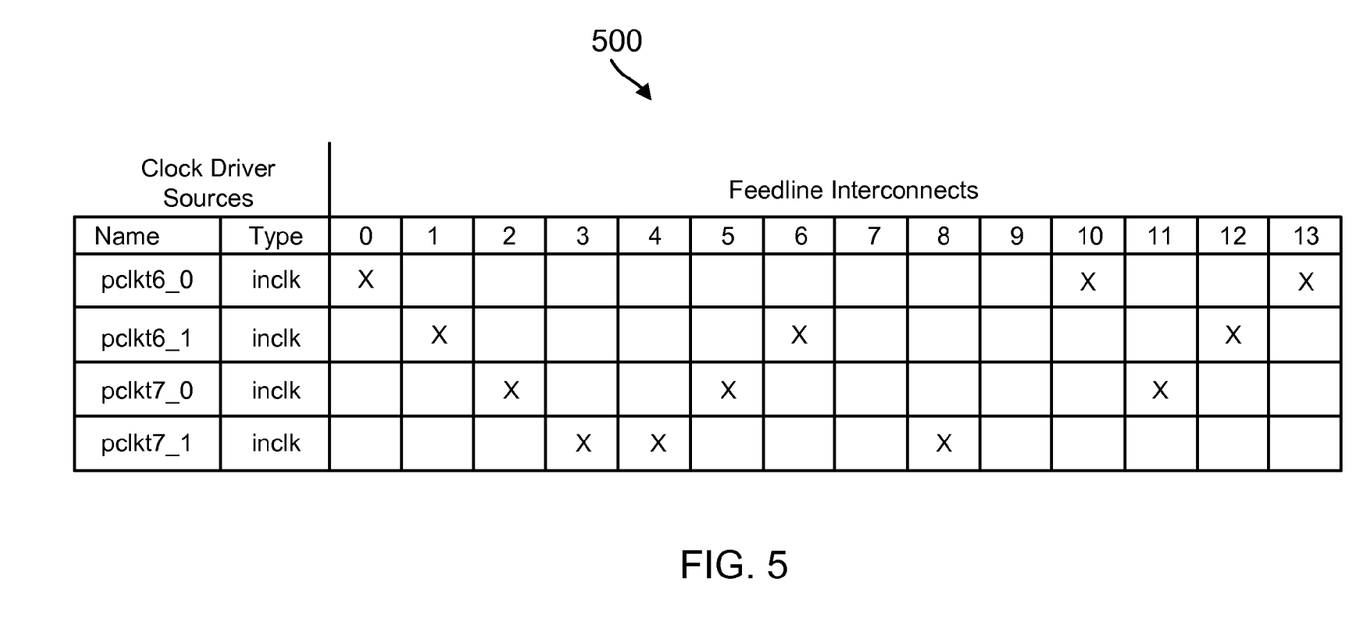
FIG. 5 illustrates a table of a feedline interconnect pattern for a PLD in accordance with an embodiment of the disclosure.

As an example, FIG. 5 illustrates a table 500 of a partial feedline interconnect pattern for PLD 100 of FIG. 4 in accordance with an embodiment of the disclosure. In the embodiment shown in FIG. 4, each checked table entry corresponds to a fuse and/or other type of configurable routing resource that can be used to connect a corresponding clock driver source (e.g., pclkt6_0, of the clock driver I/O pin 410 or inclk type of clock driver source as shown in FIG. 4) to an available feedline interconnect (e.g., feedline interconnects 416) in order to deliver one or more clock signals to center multiplexer 418 over feedline interconnects 416. For example, as shown in table 500, for a particular type of PLD 100, each clock driver source (e.g., clock driver I/O pin 410) may only connect to three out of the fourteen possible feedline interconnects 416. Thus, a method to place clock drivers of a user design into a particular PLD 100 must place clock drivers at compatible clock driver sources in PLD 100 and place corresponding feedline interconnects (e.g., by blowing fuses and/or otherwise configuring routing resources of PLD 100) available to the placed clock driver sources as limited by a feedline interconnect pattern (e.g., table 500) of PLD 100.

As discussed with respect to FIG. 3, a typical PLD design flow includes operation 340 to perform placement of components identified in a user design to assign the components to particular physical components residing at specific physical locations of PLD 100 (e.g., assigned to particular logic cells 200, logic blocks 104, clock-related circuitry 108, routing resources 180, and/or other physical components of PLD 100). In various embodiments, operation 340 may be implemented as an annealing based placement process, for example, where specialized components with limited resources (e.g., PLL components, memory components, SERDES components, and/or other specialized PLD components) are placed prior to more generally applicable components (e.g., PLBs) with relatively broad and/or indiscriminate access requirements to resources of PLD 100. In particular, clock resources may be placed before any other components of a user design, for example, and/or in conjunction with other special components, as described herein. In some embodiments, optimization processes may be performed after or as part of placement of different groups of components (e.g., after or as part of placement of clock resources), for example, and/or may be performed after all components have been initially placed.

Figure 6:
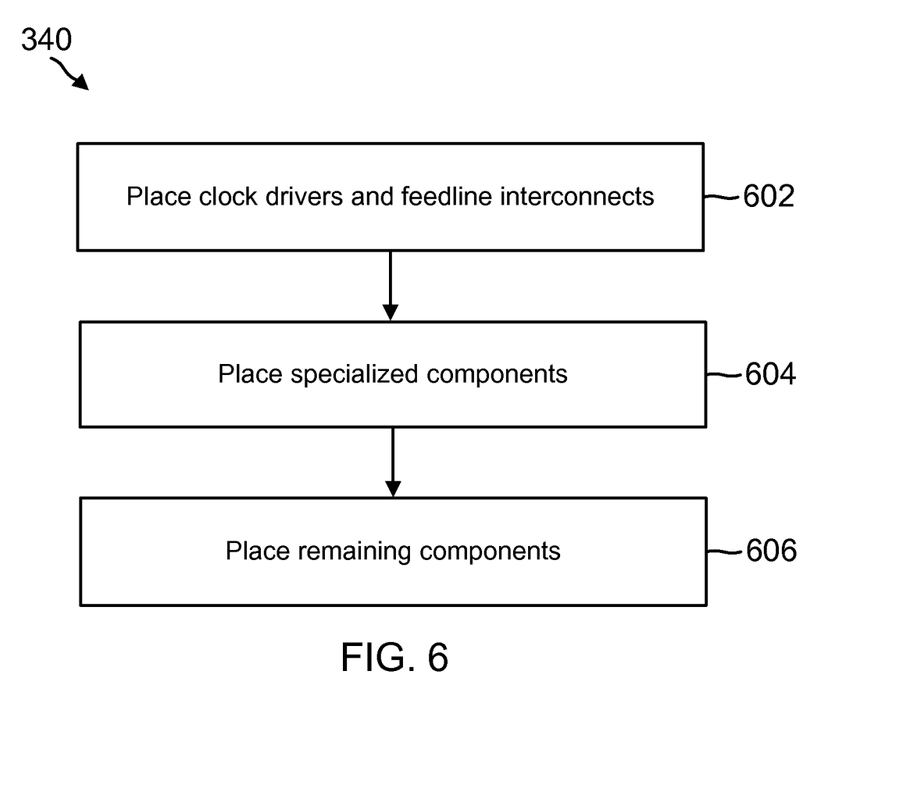
FIG. 6 illustrates a design process for a PLD in accordance with an embodiment of the disclosure.

FIG. 6 illustrates design process 340 for a PLD in accordance with an embodiment of the disclosure. For example, the process of FIG. 6 may be performed by system 130 running Lattice Diamond software to configure PLD 100, as discussed with respect to FIG. 3. More specifically, FIG. 6 illustrates an embodiment of the present disclosure where operation 340 of FIG. 3 is expanded into operations 602, 604, and 606 representing an annealing based placement process, as described herein.

In operation 602, system 130 places clock drivers and feedline interconnects designated in a design prior to placing other specialized PLD components (e.g., operation 604) and/or other remaining PLD components identified in the design (e.g., operation 606). For example, system 130 may be configured to detect clock resources in the user design (e.g., clock drivers, clock signals, feedline interconnects, and/or other features) and perform a placement process on the clock resources first or in conjunction with placing other specialized PLD components. In various embodiments, placing the clock resources may take precedence over placing other components in order to validate the design with respect to clock resources of a particular PLD (e.g., PLD 100) and/or optimize placement of the clock resources without inefficiencies caused by prior placement of other components in the design. In some embodiments, the placing processes used to place clock resources may be specifically tailored to placing clock resources, as discussed with respect to FIGS. 7-8, for example, and other placement processes may be used to place other components of the user design.

Figure 7:
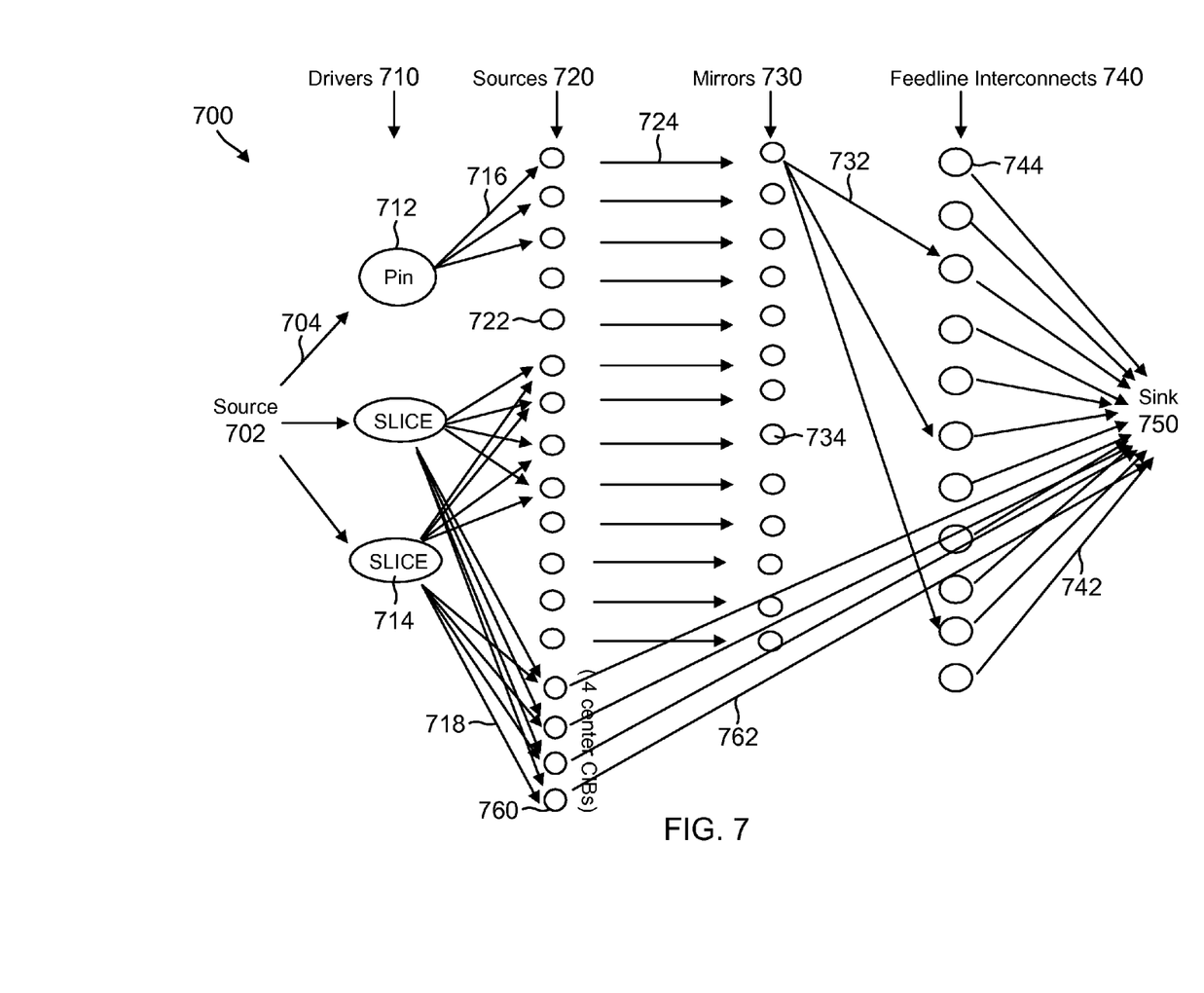
FIG. 7 illustrates a block diagram of a flow network model for a user design implemented in a PLD in accordance with an embodiment of the disclosure.

As an example of such a clock resource placing process, FIG. 7 illustrates a block diagram of a flow network model 700 for a user design implemented in a PLD in accordance with an embodiment of the disclosure. Embodiments of the present disclosure provide relatively quick and informative solutions for clock resource placement by formulating the clock resource placement according to a particular flow network model, such as flow network model 700 in FIG. 7.

A flow network is a directed acyclic graph (DAG) of vertices where each edge or line segment connecting vertices represents a conduit with a designated capacity (e.g., for clock signals, traffic, electricity and/or other materials). A DAG is usually represented as G=(V, E), where V is a set of vertices, and E is a set of edges in DAG G. The vertices in DAG G are conduit junctions. Material from source (S) to sink (T) (e.g., both vertices) of DAG G flows through the network of conduit junctions without loss (e.g., thereby enforcing "flow conservation" on the model). The maximal flow problem determines the greatest rate of flow of material from the source to the sink of a DAG G. In some embodiments, the maximum flow problem is equal to finding a cut (e.g., a partition of vertices of DAG G) in DAG G that has maximal net flow. Solutions to the maximum flow problem include the Ford-Fulkerson algorithm and/or other maximum flow problem solutions (e.g., typically in algorithm form).

As shown in FIG. 7, embodiments of the present disclosure determine a flow network model (e.g., a DAG) by forming a flow network model including four levels of vertices or nodes (e.g., drivers 710, sources 720, mirrors 730, and feedline interconnects 740) disposed between source 702 and sink 750 vertices. In various embodiments, sink 750 may correspond to center multiplexer 418, for example, and/or any other signal sink structure in a PLD that is configured to accept multiple different signals over a configurable routing fabric (e.g., feedline interconnects 416).

A first step of determining a flow network model includes adding a vertex to drivers 710 (e.g., a first level of vertices) for every clock driver detected in a user design. For example, system 130 may be configured to detect such clock drivers and/or their type in a user design and add a vertex in drivers 710 for each. As shown in FIG. 7, vertex 712 may correspond to an I/O clock driver of a user design, and vertices 714 may correspond to logic clock drivers in a user design. In other embodiments, PLL clock drivers and/or other clock driver types of a user design may be included in drivers 710. Once all detected clock drivers are added to drivers 710, source 702 may be coupled to each vertex in drivers 710 by an edge 704 with unit capacity (e.g., a capacity of one).

A second step of determining a flow network model includes adding a vertex to sources 720 (e.g., a second level of vertices) for each clock driver source available on a specific type or model of PLD selected for a user design. For example, system 130 may be configured to detect and/or determine such clock driver sources and/or their type in a PLD and add a vertex 722 in sources 720 for each. In some embodiments, the vertices 722 of sources 720 may be arranged in a site/pin pair format to more intuitively accommodate types of clock drivers in drivers 710 with multiple outputs. For example, PLL clock drivers/sources are typically implemented with two (e.g., primary and secondary) clock signal outputs. Once all detected clock driver sources are added to sources 720, each vertex in drivers 710 may be coupled to every compatible vertex in sources 720 by an edge 716 with unit capacity. For example, vertex 712 (e.g., an I/O clock driver of a user design) may be coupled to each vertex in sources 720 that is compatible with a clock driver I/O pin source (e.g., clock driver I/O pin source 410 in FIG. 4). Incompatible clock drivers and clock driver sources are not coupled by an edge.

A third step of determining a flow network model includes adding a vertex to mirrors 730 (e.g., a third level of vertices) for each clock driver source represented by a vertex in sources 720. For example, system 130 may be configured to copy or mirror vertices 722 in sources 720 (e.g., the clock driver source and/or its type) as vertices 734 in mirrors 730. Once all mirrored vertices 734 are added to mirrors 730, each vertex in sources 720 may be coupled to its corresponding mirrored vertex in mirrors 730 by an edge 724 with unit capacity. In various embodiments, mirrors 730 may be used to ensure each clock driver source is driven by a single clock driver when flow network model 700 is solved. For example, mirrors 730 may be necessary to prevent a physically infeasible situation where inflow and outflow at vertices in sources 720 are greater than one. By including mirrors 730 as essentially a mirror of sources 720, with a one to one connection, the non-physical result is foreclosed.

A fourth step in determining a flow network model includes adding a vertex to feedline interconnects 740 (e.g., a fourth level of vertices) for each feedline interconnect available to the clock driver sources in sources 720. For example, system 130 may be configured to detect and/or determine the number and/or pattern of such feedline interconnects in a PLD (e.g., feedline interconnects 416 of PLD 100 in FIG. 4) and add a vertex 744 in feedline interconnects 740 for each. Once all feedline interconnects of the selected type of PLD are added as vertices 744 to feedline interconnects 740, each vertex in mirrors 730 may be coupled to one or more vertices in feedline interconnects 740 by an edge 732 with unit capacity and according to a detected and/or determined feedline interconnect pattern (e.g., similar to Table 500 of FIG. 5) for the type of PLD. In various embodiments, this ensures that the physical limitations of feedline interconnects associated with the type of PLD are properly represented in flow network model 700. Each vertex in feedline interconnects 740 may be coupled to sink 750 by an edge 742 with unit capacity.

By modeling the problem as network flow as shown, embodiments of the present disclosure are able to solve the clock driver and feedline interconnect placement problem using any of a number of different maximum flow algorithms, in polynomial runtime, to determine capacities of edges within flow network model 700 and thereby determine the maximum flow. For example, if the determined maximal flow of flow network 700 is equal to the number of vertices in drivers 710, then a valid solution exists for that selection of clock drivers and type of PLD. If the maximum flow of flow network 700 is less than the number of vertices in drivers 710, no valid solution exists (e.g., no valid clock resource placement exists) and the user design is incompatible with the selected type or model of PLD and its corresponding clock resource constraints. In such embodiments, system 130 may be configured to terminate further placement of components (e.g., process 300 at operation 340 of FIG. 3 and/or operation 602 of FIG. 6) to conserve computing resources. In various embodiments, flow network diagram 700 may be configured to model a portion (e.g., ¼, ½, and/or other fraction) of a PLD, for example, or all clock resources of a PLD.

In further embodiments, system 130 may be configured to display the maximum flow of a non-valid solution to enable a user to adjust a user design to make it compatible with a particular PLD, for example, or to select a compatible PLD with a different selection of clock resources that are compatible with the designated user design. In other embodiments, system 130 may be configured to adjust the user design (e.g., by removing clock drivers from drivers 710, for example) to make the user design compatible with a particular PLD.

After a valid solution to flow network 700 is found, clock drivers in drivers 710 may be placed at specific clock driver sources in sources 720 (e.g., corresponding to specific clock resources in the selected PLD) by identifying all edges 716 from drivers 710 to sources 720 with positive flow. Each vertex in sources 720 receiving positive flow represents the optimized clock driver source for the corresponding clock driver in drivers 710. Likewise, each vertex in feedline interconnects 740 receiving positive flow represents the optimized feedline interconnect for the corresponding clock driver source mirrored in mirrors 730. Thus, specific clock driver sources may be routed to specific feedline interconnects accordingly.

Also shown in FIG. 7 are bypass vertices 760 in sources 720 and corresponding edges 718 and 762 linking vertices in driver 710 directly to sink 750 (e.g., center multiplexer 418 in FIG. 4). In some embodiments, a particular type of PLD may be implemented with one or more direct links (e.g., physical traces on the PLD) between clock driver sources and a clock signal sink, such as center multiplexer 418 in FIG. 4, and/or other clock signal sinks in a PLD. For example, such direct links may be configured to provide clock signals to a clock signal sink without using feedline interconnects 740 (e.g., feedline interconnects 416 of FIG. 4) and/or a corresponding feedline interconnect pattern (e.g., table 500 of FIG. 5). In some embodiments, system 130 may be configured to model such direct links in flow network model 700 by detecting the direct links in the PLD, adding a bypass vertex 760 within sources 720 for each detected direct link in the PLD, coupling compatible clock drivers in drivers 710 using edges 718 each with unit capacity, and coupling the bypass vertices in sources 720 directly to sink 750 using edges 762 each with unit capacity. In various embodiments, I/O pin type clock drivers may not be compatible with such direct links (e.g., they may not be able to physically couple to such links, such as through logic clock driver sources/fabric entries 440 of FIG. 4).

Figure 8:
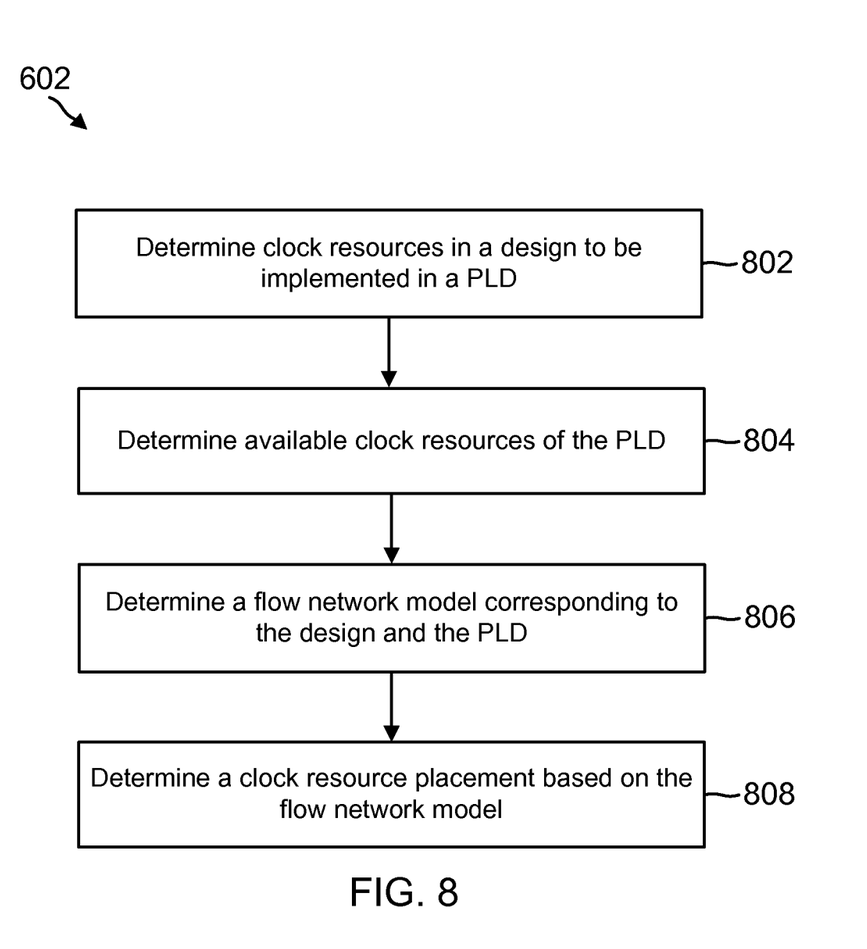
FIG. 8 illustrates a design process for a PLD in accordance with an embodiment of the disclosure.

FIG. 8 illustrates design process 602 for a PLD in accordance with an embodiment of the disclosure. For example, the process of FIG. 8 may be performed by system 130 running Lattice Diamond software to configure PLD 100, as discussed with respect to FIGS. 3 and 6. More specifically, FIG. 8 illustrates an embodiment of the present disclosure where operation 602 of FIG. 6 is expanded into operations 802, 804, 806, and 808 representing a flow network based placement process, as described herein.

In operation 802, system 130 determines clock resources in a design to be implemented in a PLD. For example, system 130 may be configured to detect and/or otherwise determine clock resources identified in the user design (e.g., clock drivers, clock signals, feedline interconnects, and/or other features) to be implemented in PLD 100. In some embodiments, the detection may be performed on one or more previously-stored synthesized and/or optimized netlists and/or NCD files, for example, and/or other files or data structures describing the design. In various embodiments, system 130 may also be configured to identify the type or model of PLD 100 from the design, for example, and/or over connection 140.

In operation 804, system 130 determines available clock resources of a PLD. For example, system 130 may be configured to determine available clock resources (e.g., clock driver sources, types of clock driver sources, feedline interconnects, and/or other features) of PLD 100 by accessing a previously-stored database of types of PLDs (e.g., and/or other files or data structures describing characteristics of PLDs) and extracting the available clock resources of PLD 100 from the database/structure. In other embodiments, system 130 may be configured to determine available clock resources in PLD 100 by accessing PLD 100 over connection 140 and/or querying PLD 100 and/or a configuration for PLD 100 for available clock resources. In various embodiments, system 130 may also be configured to identify the type or model of PLD 100 from the design and/or over connection 140 prior to determining the available clock resources.

In operation 806, system 130 determines a flow network model corresponding to a design and a PLD. For example, system 130 may be configured to determine a flow network model corresponding to the design and PLD 100 identified in operations 802 and/or 804. In various embodiments, system 130 may be configured to determine a flow network model similar to flow network model 700 of FIG. 7.

In operation 808, system 130 determines a clock resource placement based on a flow network model. For example, system 130 may be configured to determine a clock resource placement by solving (e.g., using the Ford-Fukerson algorithm and/or other network flow solution algorithms) the flow network model determined in operation 806, such as flow network model 700 of FIG. 7. Such network flow solution algorithms are typically relatively efficient as compared to random selection placement methods, for example, and in particular, the Ford-Fulkerson algorithm can produce flow network solutions in polynomial time complexity.

In embodiments where a valid solution exists (e.g., where the determined clock resource placement is valid), system 130 may be configured to complete the clock resource placement process according to the solution to the flow network model, as described herein. In embodiments where no valid solution exists (e.g., where the determined clock resource placement is invalid), system 130 may be configured to halt the placement process, request user input to provide new design information as appropriate, to adjust the user design to make the user design compatible with a particular PLD, and/or perform other operations to indicate the incompatibility of the design and the PLD and/or facilitate adjusting the design and/or the PLD to make them compatible.

Thus, embodiments of the present disclosure provide a solution for clock resource placement for complex designs with high clock usage on PLDs and/or any other devices with similar clock structures and/or design. Embodiments of the present methods solve the clock resource placement problem by modeling the problem as a maximum flow problem, using a flow network, to solve the clock resource placement problem optimally and in a timely manner.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

We claim:

1. A computer-implemented method comprising:
   determining clock resources in a design for a programmable logic device (PLD);
   determining available clock resources of the PLD;
   determining a flow network model corresponding to the design and the PLD, wherein the flow network model comprises a plurality of levels of vertices disposed between source and sink vertices, a level of vertices adjacent the sink vertex comprises a feedline interconnect vertex for feedline interconnects of the PLD, and each feedline interconnect vertex is coupled to a vertex in an adjacent level of vertices according to a feedline interconnect pattern of the PLD; and
   determining a clock resource placement based on the flow network model, wherein the clock resource placement is provided for subsequent design and configuring of a manufactured PLD or programmable logic components.

2. The computer-implemented method of claim 1, wherein the determining the flow network model comprises:
   forming the flow network model comprising the plurality of levels of vertices disposed between the source and sink vertices; and
   coupling vertices in the plurality of levels of vertices using edges with unit capacity.

3. The computer-implemented method of claim 1, wherein:

the determining the flow network model comprises forming the flow network model comprising the plurality of levels of vertices disposed between the source and sink vertices;
a first level of vertices comprises a driver vertex for every clock driver in the design; and
a second level of vertices comprises a source vertex for every clock driver source in the available clock resources of the PLD.

4. The computer-implemented method of claim 3, wherein:
the forming the flow network model comprises forming a third level of vertices comprising a mirror vertex for every vertex in the second level of vertices.

5. The computer-implemented method of claim 3, wherein:
the forming the flow network model comprises forming the second level of vertices to include a bypass vertex for every clock driver source with a direct link to the sink vertex in the available clock resources of the PLD.

6. The computer-implemented method of claim 4, wherein:
each mirror vertex is coupled to a corresponding vertex in the second level of vertices by a single edge to help prevent non-physical solutions to the flow network model.

7. The computer-implemented method of claim 1, wherein the determining the clock resource placement comprises:
solving the flow network model for a maximum flow through the flow network model; and
determining that a valid clock resource placement exists with respect to the design and the PLD, wherein a valid clock resource placement corresponds to a maximum flow equal to a number of clock drivers in the design.

8. The computer-implemented method of claim 1, wherein the determining the clock resource placement comprises:
solving the flow network model for a maximum flow through the flow network model; and
determining that no valid clock resource placement exists with respect to the design and the PLD, wherein an invalid clock resource placement corresponds to a maximum flow less than a number of clock drivers in the design.

9. The computer-implemented method of claim 1, further comprising:
placing specialized PLD components identified in the design; and/or
placing remaining PLD components identified in the design.

10. The computer-implemented method of claim 1, further comprising:
receiving the design;
synthesizing the design into the plurality of PLD components; and
mapping the plurality of PLD components to the PLD prior to determining the clock resource placement.

11. The computer-implemented method of claim 1, further comprising:
routing connections to placed PLD components;
generating configuration data to configure physical components of the PLD in accordance with a synthesized design; and
programming the PLD with the configuration data.

12. A system comprising:
a processor; and
a memory adapted to store a plurality of computer readable instructions which when executed by the processor are adapted to cause the system to perform a computer-implemented method comprising:
determining clock resources in a design for a programmable logic device (PLD);
determining available clock resources of the PLD;
determining a flow network model corresponding to the design and the PLD, wherein the flow network model comprises a plurality of levels of vertices disposed between source and sink vertices, a level of vertices adjacent the sink vertex comprises a feedline interconnect vertex for feedline interconnects of the PLD, and each feedline interconnect vertex is coupled to a vertex in an adjacent level of vertices according to a feedline interconnect pattern of the PLD; and
determining a clock resource placement based on the flow network model, wherein the clock resource placement is provided for subsequent design and configuring of a manufactured PLD or programmable logic components.

13. The system of claim 12, wherein the determining the flow network model comprises:
forming the flow network model comprising the plurality of levels of vertices disposed between the source and sink vertices; and
coupling vertices in the plurality of levels of vertices using edges with unit capacity.

14. The system of claim 12, wherein:
the determining the flow network model comprises forming the flow network model comprising the plurality of levels of vertices disposed between the source and sink vertices;
a first level of vertices comprises a driver vertex for every clock driver in the design; and
a second level of vertices comprises a source vertex for every clock driver source in the available clock resources of the PLD.

15. The system of claim 14, wherein:
the forming the flow network model comprises forming a third level of vertices comprising a mirror vertex for every vertex in the second level of vertices.

16. The system of claim 15, wherein:
each mirror vertex is coupled to a corresponding vertex in the second level of vertices by a single edge to help prevent non-physical solutions to the flow network model.

17. The system of claim 12, wherein:
the determining the clock resource placement comprises solving the flow network model for a maximum flow through the flow network model; and
a valid solution to the flow network model corresponds to a maximum flow equal to a number of clock drivers in the design.

18. The system of claim 12, wherein the computer-implemented method further comprises:
placing specialized PLD components identified in the design; and/or
placing remaining PLD components identified in the design.

19. The system of claim 12, wherein the computer-implemented method further comprises:
receiving the design;
synthesizing the design into the plurality of PLD components; and mapping the plurality of PLD components to the PLD prior to determining the clock resource placement.

20. The system of claim 12, wherein the computer-implemented method further comprises:
routing connections to placed PLD components;
generating configuration data to configure physical components of the PLD in accordance with a synthesized design; and
programming the PLD with the configuration data.

21. A non-transitory machine-readable medium storing a plurality of machine-readable instructions which when executed by one or more processors of a computer system are adapted to cause the computer system to perform a computer-implemented method comprising:
determining clock resources in a design for a programmable logic device (PLD);
determining available clock resources of the PLD;
determining a flow network model corresponding to the design and the PLD, wherein the flow network model comprises a plurality of levels of vertices disposed between source and sink vertices, a level of vertices adjacent the sink vertex comprises a feedline interconnect vertex for feedline interconnects of the PLD, and each feedline interconnect vertex is coupled to a vertex in an adjacent level of vertices according to a feedline interconnect pattern of the PLD; and
determining a clock resource placement based on the flow network model, wherein the clock resource placement is provided for subsequent design and configuring of a manufactured PLD or programmable logic components.

* * * * *